(12) United States Patent
Geyl et al.

(10) Patent No.: US 8,926,107 B2
(45) Date of Patent: Jan. 6, 2015

(54) CONTROL PANEL INCLUDING A RESISTIVE-TYPE BACKLIT KEY

(75) Inventors: Laurent Geyl, Strasbourg (FR); Eric Jany, Illkirch (FR)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 14/123,981

(22) PCT Filed: Jun. 12, 2012

(86) PCT No.: PCT/EP2012/061080
§ 371 (c)(1),
(2), (4) Date: Dec. 5, 2013

(87) PCT Pub. No.: WO2012/175369
PCT Pub. Date: Dec. 27, 2012

(65) Prior Publication Data
US 2014/0126177 A1    May 8, 2014

(30) Foreign Application Priority Data

Jun. 23, 2011 (FR) .................................. 11 55531

(51) Int. Cl.
*G01D 11/28* (2006.01)
*B60K 37/06* (2006.01)
*H03K 17/96* (2006.01)

(52) U.S. Cl.
CPC ............ *B60K 37/06* (2013.01); *H03K 17/9625* (2013.01); *B60K 2350/1036* (2013.01); *B60K 2350/2008* (2013.01); *B60K 2350/2034* (2013.01); *B60K 2350/2039* (2013.01); *H03K 2217/96042* (2013.01)

USPC ........................................ 362/23.05; 362/602

(58) Field of Classification Search
USPC ................ 362/602–603, 23.05; 200/314, 310
See application file for complete search history.

(56) References Cited

U.S. PATENT DOCUMENTS

| 5,568,367 | A | * | 10/1996 | Park | 362/109 |
| 8,247,722 | B2 | * | 8/2012 | Ominato | 200/314 |
| 2009/0277763 | A1 | * | 11/2009 | Kyowski et al. | 200/314 |
| 2010/0265184 | A1 | * | 10/2010 | Jung | 345/169 |
| 2011/0169743 | A1 | * | 7/2011 | Oh et al. | 345/169 |

FOREIGN PATENT DOCUMENTS

DE   10 2008 055865 A1   5/2010
EP       0 489 344 A1    6/1992

OTHER PUBLICATIONS

International Search Report dated Aug. 6, 2012.

\* cited by examiner

*Primary Examiner* — Anne Hines
(74) *Attorney, Agent, or Firm* — Lawrence D. Hazelton

(57) ABSTRACT

A control panel including a cover which is provided with at least one tactile pressure detection zone forming a control button, in which a force sensor is arranged between the cover and a support, behind the detection zone, in which a spacer made of elastically compressible material is mounted between the force sensor and the cover so as to take up the mechanical plays between the force sensor and the cover, characterized by the fact that the spacer is at least partially translucent and by the fact that the control panel includes at least one main light source and a light collector which permits injection of the light produced by the said main light source into the thickness of the spacer so that the spacer produces a backlighting beam directed towards a zone to be illuminated of the detection zone.

12 Claims, 2 Drawing Sheets

CONTROL PANEL INCLUDING A RESISTIVE-TYPE BACKLIT KEY

CROSS-REFERENCE TO RELATED APPLICATION

This application claims the benefit under 35 U.S.C. §371 of published PCT Patent Application Number PCT/EP 2012/061080, filed Jun. 12, 2012, claiming priority to French patent application number FR1155531 filed on Jun. 23, 2011, and published as WO2012/175369 on Dec. 27, 2012, the entire contents of which is hereby incorporated by reference herein.

TECHNICAL FIELD OF INVENTION

The present invention relates to a control panel, particularly for a motor vehicle, including a resistive backlit key.

BACKGROUND OF INVENTION

Generally, the control buttons used in a motor vehicle are of the push-button type, which is to say that they include an electrical switching device actuated by a mechanical control part. Each button, due to its dedicated kinematics, is individually visible on the fascia and this in a visual and tactile manner. To allow correct identification of the functions associated with each control button, it is known to provide each push-button with a backlit symbol arranged on the mechanical control part. To this end, a portion of the push-button includes a translucent zone in the form of the symbol and a light source is arranged behind the push-button, in the control panel, so as to emit a backlighting beam towards the symbol.

This type of backlighting is not transposable to the case of a control panel with a resistive key due to the presence of the force sensor under the pressure zone behind the cover.

SUMMARY OF THE INVENTION

The present invention relates more particularly to a control panel intended to be arranged in the passenger space of a motor vehicle, particularly on the dashboard, and which includes at least one control button in the form of a resistive key designed to control a determined function, for example to control the starting or stopping of the air-conditioning function.

The control panel includes a cover which is mounted on a support and which is provided with at least one detection zone designed to form a control button. A force sensor, or tactile sensor, is arranged between the cover and the support, behind the detection zone, so as to produce an electrical control signal when a user applies a sufficient pressure force to the detection zone.

The present invention is intended to propose a simple, effective, and economical solution to allow the backlighting of a symbol situated on the resistive key, in the tactile pressure detection zone.

To this end, the invention proposes a control panel, particularly for a motor vehicle, including a cover which is provided with at least one tactile pressure detection zone forming a control button, in which a force sensor is arranged between the cover and a support, behind the detection zone, so as to detect the actuation of the control button to produce an electrical control signal when a user applies a determined tactile pressure force to the detection zone, in which a spacer made of elastically compressible material is mounted between the sensor and the cover so as to take up the mechanical plays between the sensor and the cover, characterized by the fact that the spacer is at least partially translucent and by the fact that the control panel includes at least one main light source and a light collector which allows injection of the light produced by the said main light source into the thickness of the spacer so that the spacer produces a backlighting beam directed towards a zone to be illuminated of the detection zone, the main light source being arranged on a printed circuit board which is fixed behind the support, on the opposite side to the force sensor, a portion of the collector extending in a through hole formed in the thickness of the support opposite the main light source.

The invention allows a control panel to be obtained with backlit resistive keys in a small size and using a minimum of pieces which facilitates the assembly operations, allows more varied fascia styles, and reduces the integration costs. It permits the use of a force sensor such as a resistive sensor of FSR (Force Sensing Resistor) type without having to use transparent inks, unsuitable for motor vehicle applications, for the conductive tracks while guaranteeing good reliability of the control panel. Due to the invention the zone to be illuminated can be extended if required over the whole of the surface opposite the force sensor which offers greater freedom of definition of the pictograms of the control panel both with regard to the informative content and to the style In accordance with other advantageous characteristics of the invention: the zone to be illuminated is arranged facing the pressure-sensitive zone of the force sensor and the main light source is transversally offset relative to the zone to be illuminated; the light collector is connected to the peripheral edge of the spacer so that the light emitted by the main light source propagates into the thickness of the spacer; the collector is formed by an attached piece which is interposed between the main light source and the spacer; the collector is made in one piece with the spacer; the spacer is entirely made of translucent material, for example of the silicone type; a luminous tell-tale is associated with the detection zone and is designed to be backlit by an auxiliary light source through the sensor, the sensitive zone of the sensor defining a zone for passage of light permitting the backlighting of the luminous tell-tale; the force sensor includes a first and a second substrate at least one of which is flexible when a tactile pressure force is applied to the detection zone, conductive tracks and a resistive coating being arranged between the two substrates so as to define a pressure-sensitive zone which allows the sensor to detect the tactile pressure force by a variation in the electrical resistance between the conductive tracks through the resistive coating to produce the control signal; the sensor is of the prestressed type, the resistive coating being designed to be in electrical contact with the conductive tracks including in the absence of tactile pressure, the prestress being provided by the spacer; the control panel includes a plurality of detection zones forming a plurality of control buttons associated with a plurality of force sensors, by the fact that the spacers associated with the different detection zones are made in one piece with each other to form a plate, and the main light source illuminates a plurality of spacers of the plate; the main light source is designed to emit light in at least two distinct colors so as to permit identification of the activated state and the deactivated state of the associated control button; the zone to be illuminated of the detection zone is formed by a translucent symbol drawn on the cover.

BRIEF DESCRIPTION OF DRAWINGS

Other characteristics, aims and advantages of the invention will become apparent on reading the following detailed description, and with reference to the attached drawings, given by way of non-limiting example and in which.

DETAILED DESCRIPTION

In the remainder of the description, identical or similar elements can be designated by identical references.

Figure 1:
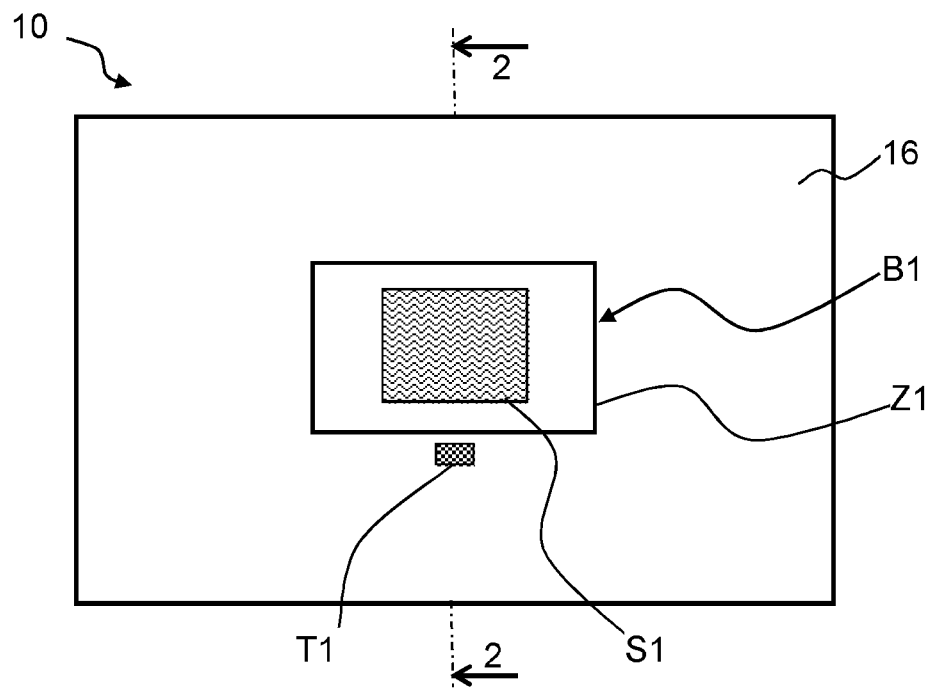
FIG. 1 is a diagram which shows seen from above a control panel including a resistive key provided with a backlit symbol made in accordance with the teachings of the invention.
Figure 2:
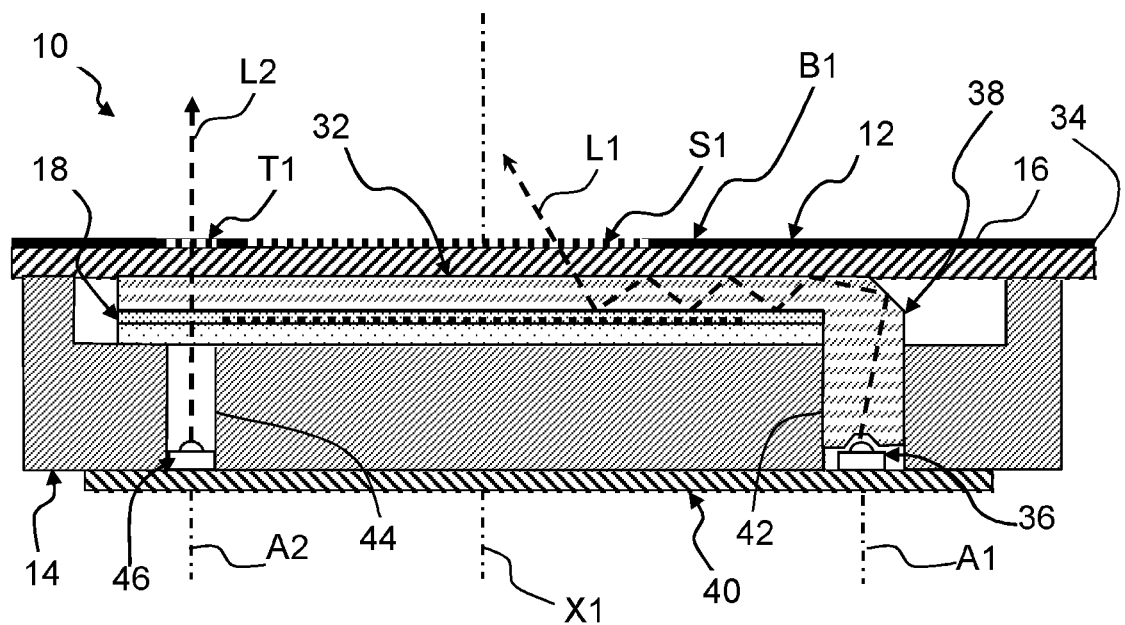
FIG. 2 is a view in axial section 2-2 which shows diagrammatically the control panel of FIG. 1.

FIGS. 1 and 2 show a control panel 10 for a motor vehicle dashboard made in accordance with the teachings of the invention. The control panel 10 includes a cover 12 the outside surface 16 of which is provided with a detection zone Z1 of a tactile pressure forming a control button B1, or resistive key.

In the remainder of the description, an axial orientation will be used in non-limiting manner along an axis X1 substantially at right-angles to the general plane of the cover 12, orientated from the front towards the rear, which generally corresponds to an orientation from top to bottom considering FIG. 2.

The control button B1 includes a force sensor 18 which is mounted between the cover 12 and a support 14 fixed to the back of the cover 12. The force sensor 18 is arranged axially facing the tactile pressure detection zone Z1, in order to allow the detection of the actuation of the control button B1 and the emission of an electrical control signal when a user applies a tactile pressure force of sufficient intensity to the detection zone Z1.

In accordance with an advantageous characteristic of the invention, the force sensor 18 is of the type with resistance variable as a function of the force, for example of the FSR (Force Sensing Resistor) type as described and illustrated in the documents US 2006/0007172A1 and WO2009/070503A1.

Figure 3:
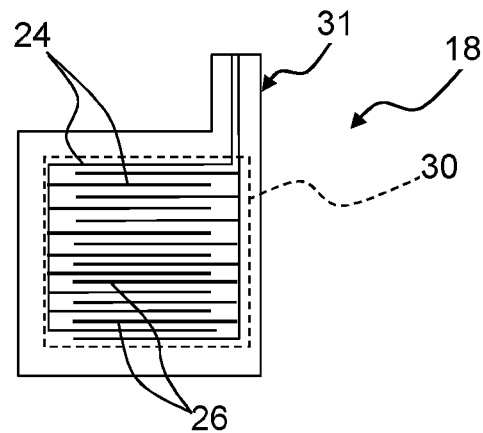
FIG. 3 is a frontal view which shows diagrammatically a film carrying a force sensor designed to permit the detection of tactile pressure on the resistive key of the panel of FIG. 1.
Figure 4:
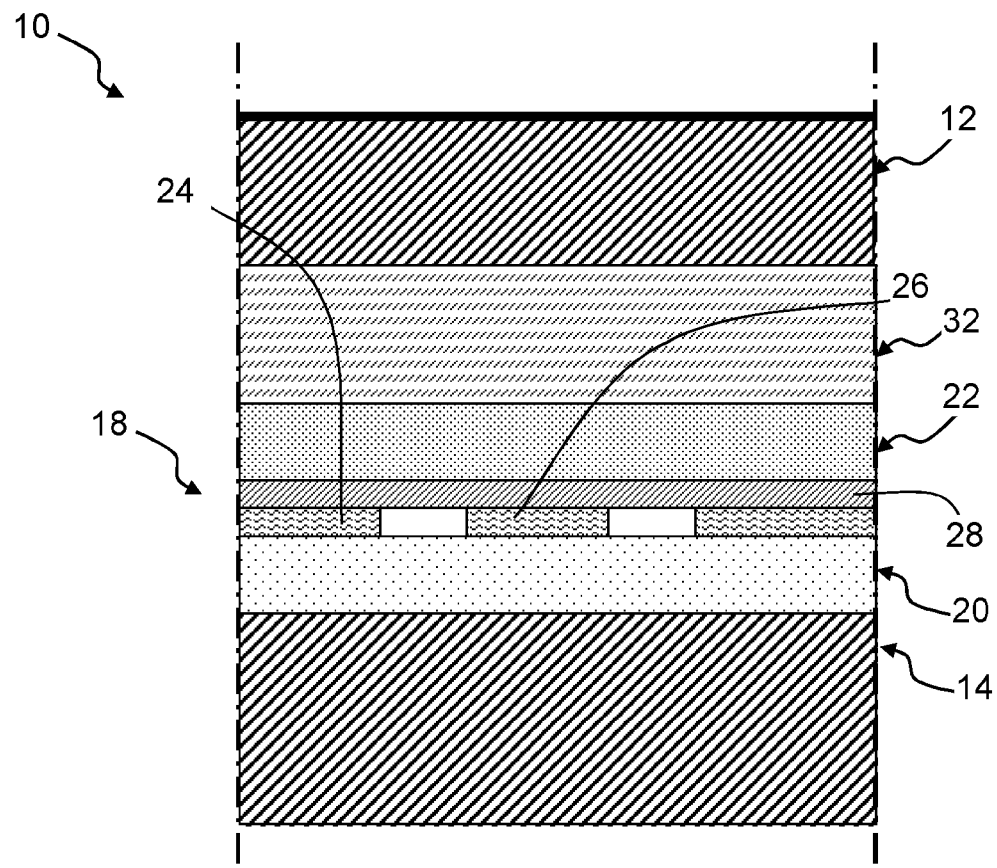
FIG. 4 is a partial view in axial section 2-2 which shows diagrammatically the structure of the force sensor of FIG. 3.

Preferably, a force sensor 18 is used here mounted under mechanical prestress, as shown in FIGS. 3 and 4. The force sensor 18 here includes a first 20 and a second 22 substrate at least one of which is flexible when a tactile pressure force is applied to the detection zone Z1. Electrical conductive tracks 24, 26 are arranged, here in the form of interdigitated combs as shown in FIG. 3, on the front face of the first substrate 20 facing a resistive coating 28 arranged on the rear face of the second substrate 22, so as to define a pressure-sensitive zone 30 which is generally superimposed on the detection zone Z1. In the rest state of the force sensor 18, in the absence of tactile pressure force, the resistive coating 28 is in electrical contact with portions of conductive tracks 24, 26.

As shown in FIG. 3, the force sensor 18 is here in the form of a film including an electrical connection tongue 31 provided with electrical connection means permitting the connection of the conductive tracks 24, 26 to an electronic control circuit (not shown).

A spacer 32 made of translucent and elastically compressible material is mounted between the force sensor 18 and the cover 12, so as to take up the mechanical plays between the force sensor 18 and the cover 12. The spacer 32 also permits maintenance of a prestressing force on the force sensor 18 including in the absence of tactile pressure on the detection zone Z1.

It is noted that, due to the rigidity of the cover 12 at the detection zone Z1, the operating plays, that is to say the axial displacements of the cover 12 at the detection zone Z1, can be less than the mechanical plays. The spacer 32 therefore allows the mechanical plays to be taken up to allow the detection of the axial displacements X1 of the cover 12 due to tactile pressures.

The spacer 32 is for example made by molding in the form of a silicone plate.

The detection zone Z1 of the control panel 10 includes a zone to be illuminated here formed by a symbol S1 designed to be backlit. The symbol S1 is formed for example on the surface of the cover 12 by laser scraping locally removing an opaque outer coating layer 34 of the cover 12, the material forming the cover 12 being substantially translucent under this coating 34.

In accordance with the embodiment shown here, a luminous tell-tale T1, designed to be backlit, is arranged in the proximity of the detection zone Z1. The luminous tell-tale T1 can be formed for example in the same manner as the symbol S1, by laser scraping, and it is intended to give the user an indication as to the state of activation or non-activation of the device associated with the actuation of the button B1, for example the engagement of the air-conditioning.

In accordance with the teachings of the invention, the control panel 10 is provided with a main light source 36 and with a light collector 38 designed to inject the light emitted by the main light source 36 into the thickness of the spacer 32 so that the spacer 32 produces a backlighting beam L1 directed towards a zone to be illuminated here formed by the symbol S1. Advantageously, the main light source 36, here formed by an electroluminescent diode, is offset transversally relative to the symbol S1 and relative to the force sensor 18. The axial direction A1 of the main lighting is therefore transversally offset outside the pressure-sensitive zone 30 of the force sensor 18.

The light collector 38 here forms an arm which extends axially towards the rear, from the peripheral edge of the spacer 32 to the main light source 36. The light collector 38 is therefore connected to the peripheral edge of the spacer 32, either by being adjacent to this peripheral edge, or by being made in one piece with the spacer 32, as is the case in FIG. 2. The light collector 38 is for example molded in the same translucent material as the spacer 32, or is over-molded with the spacer 32 from a different translucent material.

The spacer 32 is therefore used, in addition to its function of taking up the mechanical plays, as a light guide for the backlighting of the symbol S1. The spacer 32 can be provided on at least one of its main faces with refractive optical elements intended to amplify the diffusion of the light coming from the main light source 36 in zones situated opposite the symbol S1. These refractive optical elements are formed for example by relief structures such as grooves or ribs.

In accordance with the embodiment shown in FIG. 2, the main light source 36 is mounted on the front face of a printed circuit board 40 which is itself fixed on the rear face of the support 14. Preferably, this printed circuit board 40 includes an electronic circuit which controls the force sensor 18 and the main light source 36.

The support 14 here includes a main through-hole 42 facing the main light source 36 and the light collector 38 extends at least partially inside this main through-hole 42. The light collector 38 advantageously has a cross-section substantially complementary to the main through-hole 42 which allows the axial insertion of the light collector 38 in the support 14, particularly to assist the relative positioning of the spacer 32 in relation to the support 14.

In accordance with the embodiment shown, an auxiliary through hole 44 is formed in the support 14 level with the luminous tell-tale T1 and level with an auxiliary light source 46 mounted on the front face of the printed circuit board 40 in order to provide the backlighting L2 of the luminous tell-tale T1. The axial direction A2 of the auxiliary lighting is here aligned with the luminous tell-tale T1 and offset transversally outside the pressure-sensitive zone 30 of the force sensor 18.

In accordance with a modified embodiment, the main light source 36 can be designed to emit light L1 in at least two different colors which can allow identification of the activated or deactivated state of the associated function without recourse to an auxiliary luminous tell-tale T1.

In accordance with a modified embodiment (not shown), a plurality of control buttons B1 can be positioned substantially adjacently on the cover 12, the associated force sensors 18 then being arranged on a same film including the substrates 20, 22. In such a modification, the control panel 10 can include as many main light sources 36 and light collectors 38 as the number of control buttons B1, or it can include a main light source 36 and a light collector 38 common to a plurality of control buttons B1.

The printed circuit board 40 can be of rigid or flexible type. In the latter case the light source 36 and the force sensor 18 form an integral part of a single flexible printed circuit which reduces the number of pieces.

The invention claimed is:

1. A control panel for a motor vehicle, said control panel comprising:
   a cover that defines a detection zone of a tactile pressure forming a control button;
   a force sensor arranged between the cover and a support positioned behind the detection zone, said force sensor configured to detect actuation of the control button and produce an electrical control signal when a user applies a tactile pressure force to the detection zone;
   a spacer made of elastically compressible material mounted between the force sensor and the cover, wherein the spacer is configured to take up mechanical play between the force sensor and the cover, wherein the spacer is at least partially translucent;
   a main light source; and
   a light collector configured to inject light from the said main light source into the spacer so that the spacer emits a backlighting beam toward a zone to be illuminated of the detection zone, wherein the main light source is arranged on a printed circuit board positioned beside the support and the force sensor, wherein a portion of the collector extends through a through-hole defined by the support proximate to the main light source.

2. The control panel as described in claim 1, wherein the zone to be illuminated overlies a pressure-sensitive zone of the force sensor, and the main light source is transversally offset relative to the zone to be illuminated.

3. The control panel as described in claim 1, wherein the light collector is connected to a peripheral edge of the spacer so that the light emitted by the main light source propagates into the thickness of the spacer.

4. The control panel as described in claim 3, wherein the collector is formed by an attached piece interposed between the main light source and the spacer.

5. The control panel as described in claim 3, wherein collector is made in one piece with the spacer.

6. The control panel as described in claim 1, wherein the spacer is entirely made of silicone.

7. The control panel as described in claim 1, wherein a luminous tell-tale is provided proximate to the detection zone, wherein the luminous tell-tale is backlit by an auxiliary light source configured to direct light through the force sensor, wherein the pressure-sensitive zone of the force sensor defines a zone for the passage of light from the auxiliary light source to backlight the luminous tell-tale.

8. The control panel as described in claim 1, wherein the force sensor includes a first substrate and a second substrate, wherein at least one of the substrates is flexible when a tactile pressure force is applied to the detection zone, wherein the control panel includes, conductive tracks and a resistive coating arranged between the two substrates to define a pressure-sensitive zone that allows the force sensor to detect the tactile pressure force by a variation in the electrical resistance between the conductive tracks through the resistive coating to produce the control signal.

9. The control panel as described in claim 8, wherein the force sensor is of the prestressed type, the resistive coating is in electrical contact with the conductive tracks including in the absence of tactile pressure, and the prestress is provided by the spacer.

10. The control panel as described in claim 1, wherein the control panel includes a plurality of detection zones forming a plurality of control buttons associated with a plurality of force sensors, and a plurality of spacers associated with the plurality of detection zones that are made in one piece with each other to form a plate, wherein the main light source is configured to illuminate the a plurality of spacers of the plate.

11. The control panel as described in claim 1, wherein the main light source is configured to emit light in at least two distinct colors effective to identify an activated state and a deactivated state of the associated control button.

12. The control panel as described in claim 1, wherein the zone to be illuminated of the detection zone includes a translucent symbol on the cover.

* * * * *